United States Patent [19]

Weber

[11] 4,190,807
[45] Feb. 26, 1980

[54] SAMPLED ERROR PHASELOCK OR FREQUENCYLOCK SYSTEMS

[75] Inventor: Robert J. Weber, Marion, Iowa

[73] Assignee: Rockwell International Corporation, El Segundo, Calif.

[21] Appl. No.: 921,676

[22] Filed: Jul. 3, 1978

[51] Int. Cl.² .............................................. H03B 3/04
[52] U.S. Cl. .................................... 331/1 A; 325/184; 328/155; 329/110; 331/17; 331/25; 332/19
[58] Field of Search .................. 325/134, 184; 332/18, 332/19, 37 R, 37 D, 38; 331/1 R, 1 A, 17, 18, 25; 307/232; 328/155; 329/110, 50

[56] References Cited

U.S. PATENT DOCUMENTS

| 3,676,794 | 7/1972 | Bidell et al. | 331/1 A |
|---|---|---|---|
| 3,840,821 | 10/1974 | Conway | 331/1 A |
| 4,057,768 | 11/1977 | Juliusburger | 331/1 A |
| 4,121,162 | 10/1978 | Alberkrack | 331/1 A |

*Primary Examiner*—Siegfried H. Grimm
*Attorney, Agent, or Firm*—Terry M. Blackwood; Richard A. Bachand; H. Fredrick Hamann

[57] ABSTRACT

Phaselock or frequencylock systems employ sampling means and memory means to effect control. Adjustments in phase or frequency are made according to stored signals and the stored signals are updated in accordance with samples of an error indicative signal.

15 Claims, 6 Drawing Figures

SAMPLED ERROR PHASELOCK OR FREQUENCYLOCK SYSTEMS

This invention relates to electronic systems and in the preferred embodiment to phaselock systems and to preventing coincidental phase modulation in the output of pulsed RF transmitters.

As recognized in U.S. Pat. No. 3,831,094, assigned to the assignee hereof, many broadcast type AM transmitters can produce coincidental and undersirable phase modulation of the transmitted carrier. Similarly, coincidental phase modulation can arise in the output of pulse radar or other pulsed RF transmitters due to such things as electrical and thermal transients in transmitter components including pulse amplifiers, gates, switches, etc. This coincidental phase modulation causes spreading and/or smearing of the frequency spectrum energy distribution and can thus necessitate a wider receiver bandwidth than might be desired. However the phaselock apparatus described in said patent for preventing coincidental phase modulation can often prove less than ideal in pulsed RF type transmitters because the time lag in achieving phase correction may exceed approximately $(1/f_{loop})$ where $f_{loop}$ is the bandwidth of the corrector loop.

In accordance with the preferred application of the present invention there is provided a system which prevents the above described coincidental phase modulation on transmitted RF pulses.

These and other objects, advantages and features of the present invention, including applications thereof to modulators and demodulators, will become more apparent upon reference to the following specification, claims, and appended drawings in which:

Figure 1:
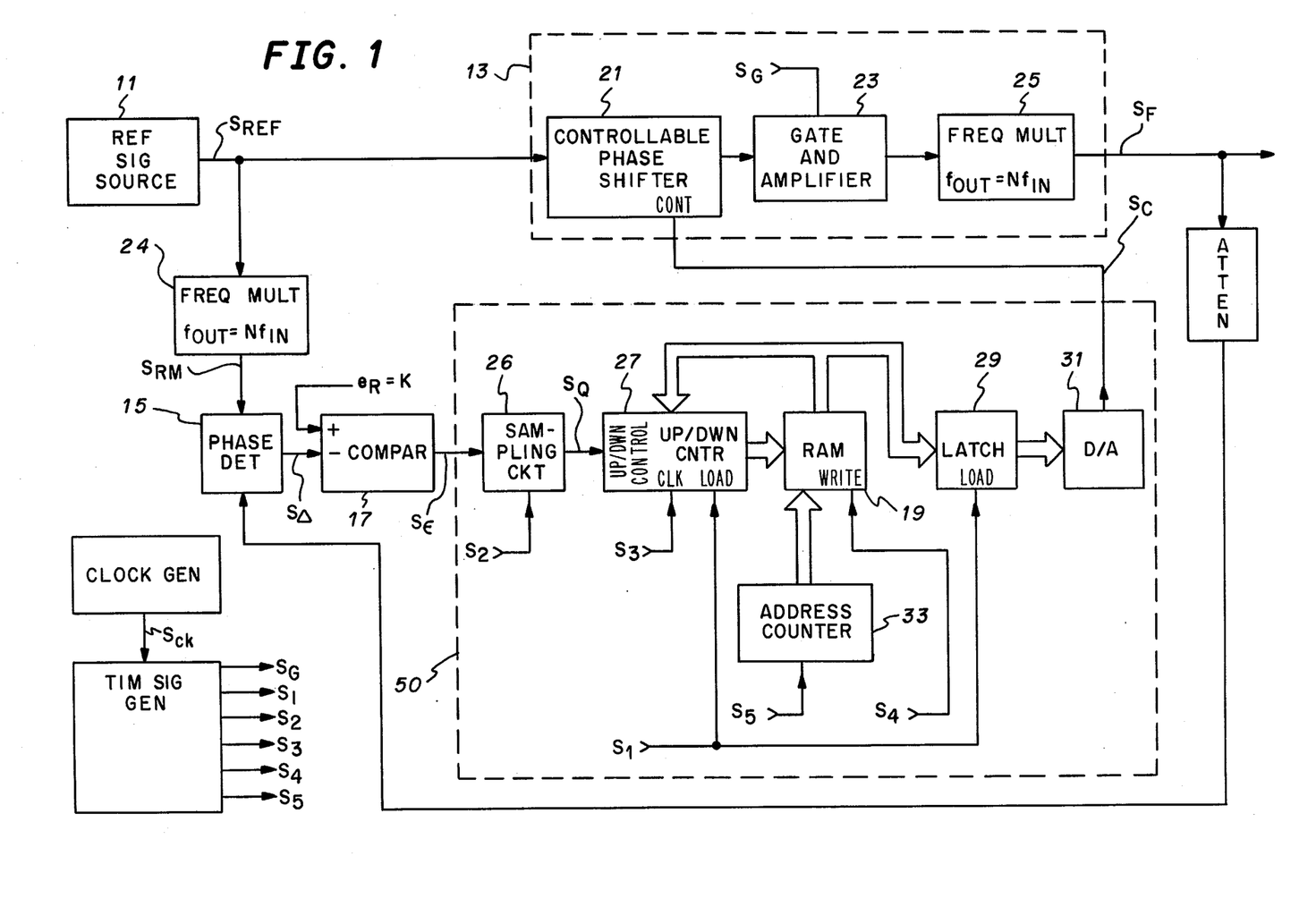
FIG. 1 is a block diagram schematic illustrating the presently preferred inventive embodiment.

In the preferred embodiment illustrated in FIG. 1, a reference CW signal source 11 supplies a carrier signal $S_{REF}$ of stable phase and frequency to an angularly modulatable element 13 which provides a PAM carrier signal (RF pulse train) $S_F$ whose phase, due to adjustments effected by $S_C$, is eventually caused to track the phase of carrier signal $S_{RM}$. Phase detector 15 receives at separate inputs $S_{RM}$ and an attenuated version of $S_F$ and outputs a signal $S_\Delta$ indicative of difference in phase between $S_{RM}$ and $S_F$. Comparator 17 receives $S_\Delta$ and $e_R$ (a constant voltage, usually ground in the FIG. 1 embodiment) and outputs a signal $S_\epsilon$ indicative of the difference in amplitude between $S_\Delta$ and $e_R$. To briefly preface a more detailed description hereinbelow, each part of $S_\epsilon$ which is time coincident with an $S_F$ pulse is sampled at regular intervals, the individual samples causing updating or further correcting of corresponding digital words stored in RAM 19. While said updating is being effected the words in RAM 19 which are not yet updated are being outputted and converted into a series of control signals which together constitute the signal $S_C$ and which control phase shifter 21. When lock is attained, phase shifter 21 is caused by $S_C$ to introduce phase modulation complementary to that coincidentally caused by the networks in items 23 and 25 such that the phase of $S_F$ tracks the phase of $S_{RM}$. For the FIG. 1 apparatus, the phase $\psi_R(t)$ of $S_{RM}$ is, except for long term drift, essentially equal to $\omega_c t + \alpha$, where $\omega_c$ is the radian frequency of the carrier and $\alpha$ is a non-time-varying, or constant, phase angle. When lock is attained the phase $\psi_F(t)$ of $S_F$ tracks $\psi_R(t)$ such that $\psi_F(t) = \psi_R(t) + \beta$, where $\beta$ is a constant phase angle which depends on the constant value K used for $e_R$.

In the presently preferred implementation, $S_{RM}$ is a frequency multiple of $S_{REF}$ and is produced from $S_{REF}$ by a frequency multiplier 24 as shown in FIG. 1. Multiplier 24 presently comprises a varactor diode multiplier such that the frequency multiple N is twelve. A second frequency multiplier 25, also a varactor diode multiplier whose N=12, is employed as shown in FIG. 1 following item 23.

Also in the presently preferred implementation, comparator 17 comprises a non-hysteretic op-amp comparator having its non-inverting input connected to ground and its inverting input tied to $S_\Delta$. Sampling circuit 26 presently comprises a D type flip-flop having its D input connected to $S_\epsilon$, its C or clock input tied to $S_2$, and its Q output tied to the up/down control input of counter 27. Thus for positive $S_\Delta$, $S_\epsilon$ is a low logic state, and following an $S_2$ clock pulse, the Q output is forced low. With its control input low, counter 27 counts up from the count at which it was initialized. Analogously, for negative $S_\Delta$, $S_\epsilon$ is a high logic state, and, following an $S_2$ clock pulse the Q output is forced high. With its control input high, counter 27 counts down from the count at which it was initialized. RAM 19 supplies each of these initial counts or digital words to counter 27 and afterward writes the updated count or digital word into the storage location previously occupied by the initializing word. RAM 19 also supplies each of these initial words to latch 29 which, for a predetermined time as determined by $S_1$, holds each word and outputs same to D/A converter 31. Thus is effected a series of control words, or more generally a series of control signals, which together constitute a composite control voltage or control signal $S_C$. Adjustments in phase are effected by $S_C$ controlling a varactor in a variable RC network in item 21.

Figure 2:
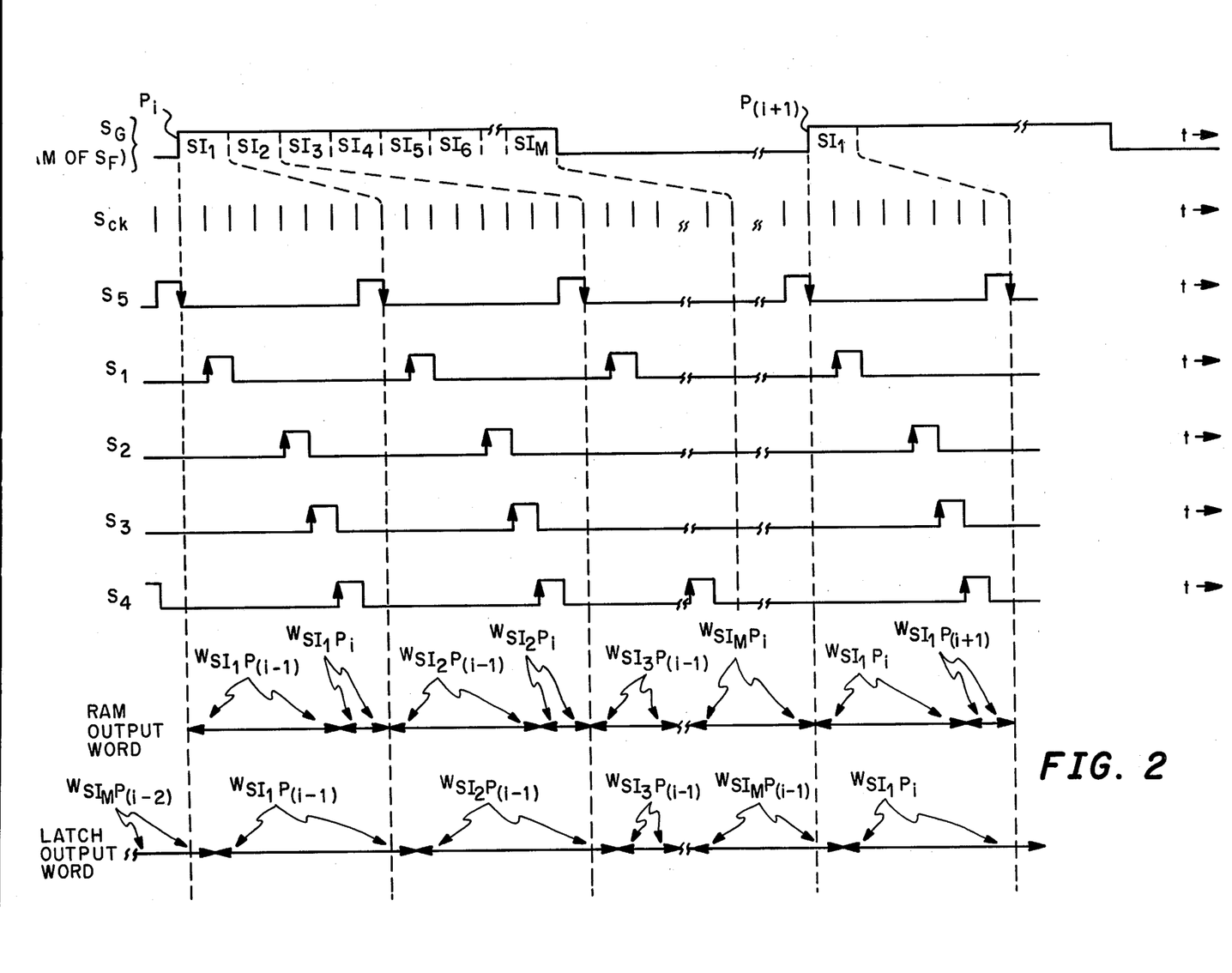
FIG. 2 shows waveforms useful in explaining the operation of the FIG. 1 apparatus.

Simultaneous reference will now be made to FIG. 1 and the waveforms of FIG. 2 for a more detailed description of the FIG. 1 apparatus and its operation. As noted hereinabove, in the preferred implementation, $S_F$ is an RF pulse train effected by amplitude modulating $S_{REF}$ with the pulse waveform $S_G$. Timing signals $S_1$ through $S_5$ are coordinate with one another and with $S_G$ as shown in FIG. 2, all being synchronized by the master clock signal $S_{CK}$. As seen in FIG. 2 the time axis of $S_G$ is, for purposes of clarity in illustration, compressed relative to the other illustrated waveforms, the time relationship therebetween being indicated by the vertical dashed lines. More particularly, each $S_G$ or $S_F$ pulse is divided into M sample intervals and each sample interval covers eight master clock or $S_{CK}$ intervals. The $S_G$ pulses are variable in width and the value of M changes according to said width, the maximum value of M presently being 16.

Looking for example at what happens during the second sample interval ($SI_2$) of the ith $S_G$ or $S_F$ pulse ($P_i$), $S_5$ at the outset effects a new RAM address via address counter 33 and causes the stored word for $SI_2$ of the preceding $S_F$ pulse, namely $P_{(i-1)}$, to appear at the RAM 19 output. One $S_{CK}$ interval later, $S_1$ causes this word, namely $W_{SI2P_{(i-1)}}$, to become loaded into up/down counter 27, thereby initializing 27, and also to become loaded into latch 29. Latch 29 then provides this word (until the next $S_1$ pulse) to D/A converter 31 which converts same to a control signal and effects adjustment of phase shifter 21. After sufficient time has elapsed for this adjustment to become reflected in $S_F$ and thus $S_\epsilon$ (three $S_{CK}$ intervals in the present implementation), $S_2$ effects a sampling of $S_\epsilon$, causing $S_Q$ to go high or low depending on the state of $S_\epsilon$. Counter 27, depending on the state of $S_Q$, then adds to or substracts from its initial count the one count effected by the single $S_3$ pulse. This updated count or word, namely, $W_{SI2P_i}$, is then written or loaded into RAM 19 at the occurrence of the $S_4$ pulse thereby replacing the initial word at this RAM address. At the beginning of the third sample inerval $SI_3$, $S_5$ effects a new RAM address, namely that for word $W_{SI3P_{(i-1)}}$ and the above procedure is repeated. Similarly through the Mth sample interval. For the next $S_F$ pulse, namely $P_{(i+1)}$, phase adjustments are made according to the RAM words written during the ith pulse $P_i$ and each RAM word is updated to reflect need for additional phase adjustment. And so on until the phase is barely overadjusted, at which time, since the system has no hysteresis, each of the sixteen (or fewer, depending on M) control signals will alternately overadjust slightly and then underadjust slightly like a bang-bang servo. Of course hysteresis could be added by modifying the comparator circuit to include feedback and thus a steady state solution accurate to within one least significant bit could be achieved.

Additional details of the presently preferred implementation are as follows: $S_F$ carrier frequency is approximately $9.33 \times 10^9 Hz$; $S_G$ and $S_F$ pulse width is variable from approximately 2 to 16 microseconds; PRF of $S_G$ and $S_F$ is approximately 192Hz; frequency of $S_{CK}$ is approximately 6.94MHz; RAM organization is sixteen 8-parallel-bit words.

To summarize the foregoing, during each $S_F$ pulse the output of the RAM 19 is applied through latch 29 and D/A converter 31 to phase shifter 21 to reduce the phase difference between $S_{REF}$ and $S_F$. Also during each $S_F$ pulse, the difference in phase which still remains after the latest adjustment is sampled and used to update the RAM. The updated RAM content is not used to adjust the phase during the pulse it is sampled on but instead is applied later to a successive pulse. During any one $S_F$ pulse a fraction (M/16) of the whole memory is applied to effect phase adjustments and simultaneously (M/16) of the whole memory is updated for effecting later adjustments. The reason that presently detected errors are used to make later occurring corrections or adjustments is that the system is assumed to be pseudo-repetitive pulse to pulse. In other words, the pulse phase distortion characteristic of gate and amplifier 23 and the frequency multiplier 25 varies slowly with respect to the pulse repetition rate and loop bandwidth of the system.

It should be apparent to those skilled in the art that various modifications may be made to the FIG. 1 apparatus without departing from the principles therein involved. For example, phase shifter 21 could be replaced by a VCO (voltage controlled oscillator) controlled by signal $S_C$. Of course no connection would be needed between reference signal source 11 and such VCO. As a second example, reference signal source 11, which is preferably CW, could be replaced with a pulsed reference source and thus the gate part of item 23 could be eliminated. Further exemplary, phase shifter 21 could be digitally controlled thereby eliminating the need for D/A converter 31; the memory could comprise an analog instead of digital memory; $S_3$ pulses could be more frequent than one per sample interval. Moreover, a plurality of memory words needs not be updated each $S_F$ pulse. For instance the word for only one sample interval could be updated for pulse one, the word for another sample interval could be updated for pulse two, and so on.

Figure 3:
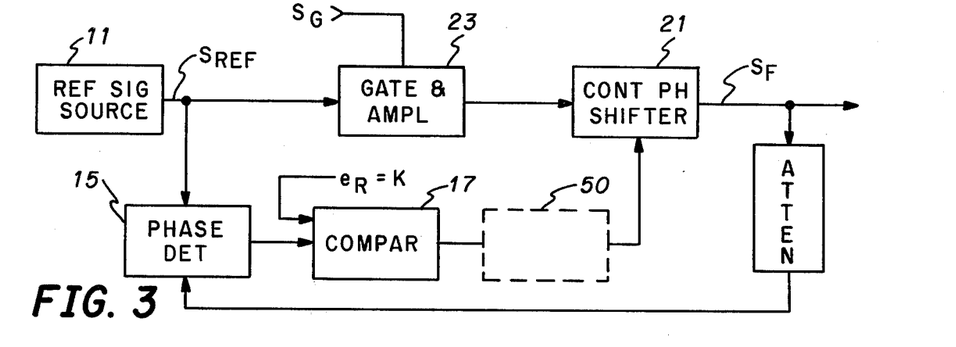
FIGS. 3 and 4 are block diagram schematics illustrating two possible variations of the FIG. 1 apparatus.
Figure 4:
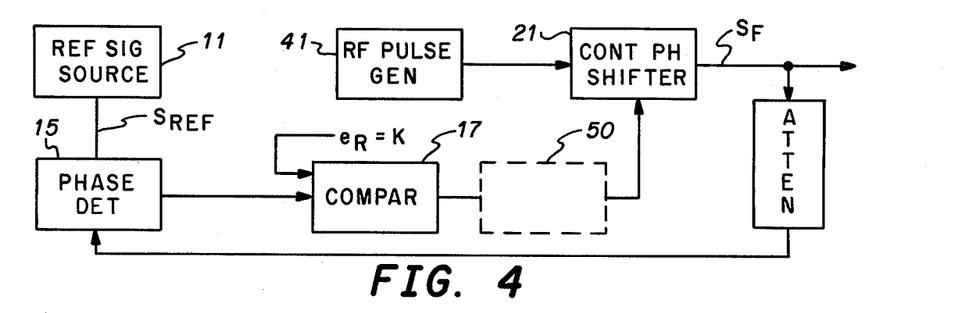
Figure 5:
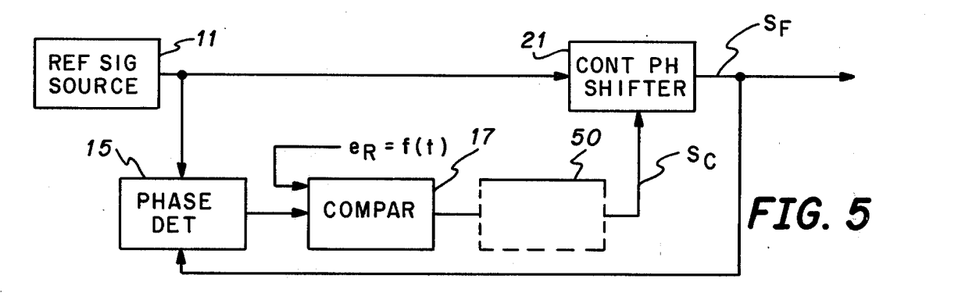
FIGS. 5 and 6 are block diagram schematics of additional variations, namely, a modulator and a demodulator respectively, embodied in accordance with the principles of the present invention.

As shown in FIG. 3, an appropriate phase shifter could be relocated at the output (instead of at the input) of item 23. As is also indicated by FIG. 3 (and also by FIGS. 4, 5, and 6), frequency multiplication, as accomplished in the FIG. 1 apparatus by multipliers 24 and 25, is not essential. Further, as shown in FIG. 4, the gate and amplifier 23 could be replaced with an RF pulse generator 41 which is completely independent of the reference signal source 11.

The principles of the present invention may also be employed to realize angle modulators and demodulators. For example, in FIG. 5, if $e_R$ is, say, a sawtooth waveform, the loop will eventually force the phase modulation of the carrier $S_F$ to follow a similar sawtooth variation so that both comparator input signals are the same. Comparator input $e_R$ may comprise other non-constant functions of time. For instance, $S_F$ can constitute a chirp type signal with an appropriate $e_R$ input waveform.

Figure 6:
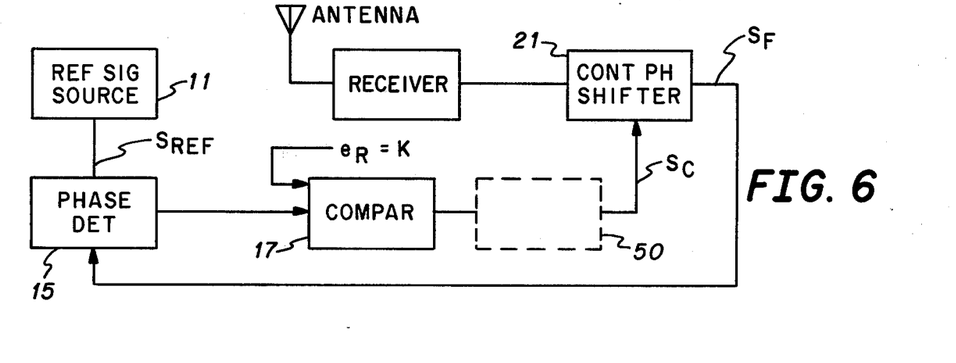

As shown in FIG. 6, a phase demodulator may be realized by setting $e_R$ to some constant value such as ground and connecting a receiver output into an appropriate controllable phase shifter. For an appropriate received signal, the loop will eventually cause $S_F$ to track $S_{REF}$ at least to within a constant phase angle. When lock is attained, $S_C$ will comprise a functionally related complement of the phase modulation on the receiver output signal. By connecting the receiver output directly into the phase detector and relocating the phase shifter to a position between the reference signal source and the phase detector, $S_C$ will tend to match, instead of complement, the phase modulation on the receiver output signal.

Furthermore, in all foregoing examples, the output signal of the reference signal source has been assumed to contain no angle modulation. That is, $\psi_R(t)$ has been assumed to be essentially equal to $\omega_c t + \alpha$ where $\alpha$ is a constant phase angle. This condition is not essential. For instance $\psi_R(t)$ could be equal to $\omega_c t + \alpha(t)$ where $\alpha(t)$ is a suitable non-constant function of time.

Furthermore, although the foregoing systems are phaselock systems and thus inherently frequencylock systems, minor modification will yield systems which are frequencylock only; i.e., locked only in frequency and not in phase. More particularly, since instantaneous radian frequency $\omega(t)$ is classically defined as the first derivative of phase $\psi(t)$ of a harmonic oscillation $Ae^{i\psi(t)}$ $$\text{(i.e., } \omega(t) = \frac{d\psi(t)}{dt}\text{),}$$

the signal $S_\Delta$ which is a function of phase difference is also a function of frequency difference. Thus, using FIG. 1 as an example, as signal $S_F$ locks on to signal $S_{RM}$ such that the phase difference therebetween approaches zero, the frequency difference between $S_F$ and $S_{RM}$ also approaches zero. Thusly, modification of the FIG. 1 apparatus so as to yield a frequencylock-only system could comprise the replacement of phase shifter 21 with a VCO controlled by $S_c$ and having no input from 11, and the replacement of phase detector 15 with a frequency difference detector.

Further exemplary, suitable combination of the above-described individual modifications will yield additional variations.

Thus while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. The phaselock system comprising:
   first means for providing a first carrier signal;
   second means for supplying a second carrier signal in the form of a train of pulses of carrier signal;
   controllable third means for effecting chanbge in the phase of said second carrier in accordance with a signal $\sigma_c$;
   fourth means, including phse detector means, for providing a signal indicative of difference between $(\eta_l(t)+\mu)$ and $\eta_2(t)$ where $\eta_1(t)$ and $\eta_2(t)$ are the phases of said first and second carrier signals respectively, and $\mu$ is a constant phase angle;
   fifth means for storing all at one time, and serially outputting at each pulse occurrence, 1st through Uth individual control signals each of which comprises a component of $\sigma_c$, U being a predetermined integer $\geq 2$; and
   sixth means for (a) effecting 1st through Uth successive intervals during each of the pulses of the pulse train, said 1st through Uth intervals corresponding, respectively, to said 1st through Uth control signals, (b) sampling the difference indicative signal during at least one of these U intervals of a train pulse $P_j$, and (c) updating the appropriate one of the U control signals in accordance with the sample such that the updated control signal effects, only at pulses succeeding $P_j$, a change in $\eta_2(t)$ which brings it nearer to $(\eta_1(t)+\mu)$.

2. The system as defined in claim 1 wherein said sixth means samples the difference indicative signal during each of a plurality of said U intervals of pulse $P_j$ and updates each of a plurality of said U control signals.

3. The system as defined in claim 1 wherein each of said control signals comprises a digital word.

4. The phaselock system comprising:
   first means for providing a first carrier signal having phase $\phi_1(t)$;
   angularly modulatable second means for providing a second carrier signal whose phase $\phi_2(t)$ is to eventually follow $\phi_3(t)$ where $\phi_3(t)=\phi_1(t)+\theta(t)$ and $\theta(t)$ is a prescribed function of time;
   third means, including phase detector means, for providing a signal indicative of difference between $\phi_2(t)$ and $\phi_3(t)$;
   fourth means for storing all at one time, and serially outputting, 1st through Uth individual control signals for producing adjustment of said angularly modulatable means and thus of $\phi_2(t)$, U being a predetermined integer $\geq 2$, and the serial outputting of 1st through Uth control signals reoccurring at predetermined times; and
   fifth means for sampling the difference indicative signal during at least one control signal adjustment of $\phi_2(t)$ and updating this control signal in accordance with the sample such that the updated control signal, at reoccurrence of the fourth means serial outputting, effects an adjustment of $\phi_2(t)$ which brings it nearer to $\phi_3(t)$.

5. The system as defined in claim 4 wherein a predetermined one of $\phi_1(t)$ or $\phi_2(t)$ is essentially equal to $(\omega_c t+\epsilon)$ where $(\omega_c/2\pi)$ is the frequency of the corresponding carrier signal and $\gamma$ is a constant phase angle.

6. The system as defined in claim 5 where $\phi(t)$ is essentially equal to $\rho$ where $\rho$ is a constant phase angle.

7. The system as defined in claim 4 where $\phi(t)$ is essentially equal to $\rho$ where $\rho$ is a constant phase angle.

8. The system as defined in claim 4 wherein said second means includes means for providing said second carrier signal in the form of a train of pulses of carrier signal.

9. The system as defined in claim 8 wherein $\phi_1(t)$ is essentially equal to $(\omega_c t+\gamma)$ where $(\omega_c/2\pi)$ is the frequency of said first carrier signal and $\gamma$ is a constant phase angle.

10. The system as defined in claim 9 wherein $\theta(t)$ is essentially equal to $\rho$ where $\rho$ is a constant phase angle.

11. The system as defined in claim 10 wherein said fifth means comprises means for sampling the difference indicative signal during each of a plurality of the U control signal adjustments of $\phi_2(t)$ and updating a plurality of corresponding control signals each in accordance with a different and appropriate one of the samples.

12. The system as defined in claim 10 wherein said fifth means comprises means for sampling the difference indicative signal during each of the U control signal adjustments of $\phi_2(t)$ and updating each of the corresponding control signals in accordance with a different and appropriate one of the samples.

13. The system as defined in claim 4 wherein each of said control signals comprises a digital word.

14. The system comprising:
    angularly modulatable means for providing a carrier signal whose phase $\phi_a(t)$ is to eventually follow $\phi_b(t)$ where $\phi_b(t)$ is a prescribed function of time,
    means for providing a signal which is a function of difference between $\phi_a(t)$ and $\phi_b(t)$, and
    means for (i) storing all at one time, and serially outputting, 1st through Uth individual control signals for producing adjustment of said angularly modulatable means and thus of $\phi_a(t)$, U being a predetermined integer $\geq 2$, and the serial outputting of 1st through Uth control signals reoccurring at predetermined times, (ii) sampling the difference indicative signal during at least one control signal adjustment of $\phi_a(t)$, and (iii) updating this control signal in accordance with the sample such that the updated control signal, at reoccurrence of the serial outputting, effects an adjustment of $\phi_a(t)$ which brings it nearer to $\phi_b(t)$.

15. The system comprising:
    angularly modulatable means for providing a carrier signal having frequency $\omega_x(t)$ which is to eventually follow $\omega_y(t)$ where $\omega_y(t)$ is a prescribed function of time,
    means for providing a signal which is a function of difference between $\omega_x(t)$ and $\omega_y(t)$, and
    means for (i) storing all at one time, and serially outputting, 1st through Uth individual control signals for producing adjustment of said angularly modulatable means and thus of said carrier signal, U being a predetermined integer $\geq 2$, and the serial outputting of 1st through Uth control signals reoccurring at predetermined times, (ii) sampling the frequency difference dependent signal during at least one control signal adjustment of the carrier, and (iii) updating this control signal in accordance with the sample such that the updated control signal, at reoccurrence of the serial outputting, effects an adjustment of the carrier so as to reduce the difference between $\omega_x(t)$ and $\omega_y(t)$.

* * * * *

UNITED STATES PATENT AND TRADEMARK OFFICE
CERTIFICATE OF CORRECTION

PATENT NO. : 4,190,807          Page 1 of 3
DATED : Feb. 26, 1980
INVENTOR(S) : Robert J. Weber It is certified that error appears in the above–identified patent and that said Letters Patent are hereby corrected as shown below:

IN THE SPECIFICATION

Column 2, line 52, delete "coordinate" and substitute therefor --coordinated--.

Column 2, line 68, inside the parenthesized subscript following the capital letter P, delete the lower case letter "l" and substitute therefor the number --1--.

Column 3, line 14, delete "$W_{SI2P_i}$" and substitute therefor --$W_{SI_2P_i}$--.

Column 3, line 18, delete the word "inerval" and substitute the word --interval--.

Column 3, line 19, delete "$W_{SI3P_{(i-1)}}$" and substitute therefor --$W_{SI_3P_{(i-1)}}$--.

Column 3, line 21, inside the parenthesized

UNITED STATES PATENT AND TRADEMARK OFFICE
CERTIFICATE OF CORRECTION

PATENT NO. : 4,190,807
DATED : Feb. 26, 1980
INVENTOR(S) : Robert J. Weber

It is certified that error appears in the above-identified patent and that said Letters Patent are hereby corrected as shown below:

subscript following the capital letter P, delete the lower case letter "l" and substitute therefor the number --1--.

Column 3, line 43, delete "$S_{REF}$ and $S_F$" and substitute therefor --$S_{REF}$ and $S_F$--.

IN THE CLAIMS

Column 5, line 22, delete "chanbge" and substitute therefor --change--.

Column 5, line 25, delete "phse" and substitute therefor --phase--.

Column 5, line 27, delete "$(nl(t)+\mu)$" and substitute therefor --$(n_1(t)+\mu)$--.

UNITED STATES PATENT AND TRADEMARK OFFICE
CERTIFICATE OF CORRECTION

PATENT NO. : 4,190,807        Page 3 of 3

DATED : Feb. 26, 1980

INVENTOR(S) : Robert J. Weber

It is certified that error appears in the above-identified patent and that said Letters Patent are hereby corrected as shown below:

Column 6, line 10, delete "$(\omega_c t + \epsilon)$" and substitute therefor $--(\omega_c t + \gamma)--$.

*Signed and Sealed this*

*Seventeenth* Day of *June 1980*

[SEAL]

Attest:

SIDNEY A. DIAMOND

*Attesting Officer*     *Commissioner of Patents and Trademarks*